US006380787B1

(12) United States Patent
Forbes

(10) Patent No.: US 6,380,787 B1
(45) Date of Patent: Apr. 30, 2002

(54) INTEGRATED CIRCUIT AND METHOD FOR MINIMIZING CLOCK SKEWS

(75) Inventor: Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/386,505

(22) Filed: Aug. 31, 1999

(51) Int. Cl.⁷ .............................. G06F 1/04; H03K 3/013
(52) U.S. Cl. .................. 327/292; 333/17.3; 333/30; 326/30; 327/52
(58) Field of Search ................................. 327/292, 293, 327/295, 297, 299, 52; 330/20; 326/21, 30; 333/17.3, 32

(56) References Cited

U.S. PATENT DOCUMENTS

| 4,855,696 A | * | 8/1989 | Tan et al. ................. 333/20 |
| 4,860,322 A | | 8/1989 | Lloyd ...................... 375/107 |
| 5,086,271 A | * | 2/1992 | Haill et al. .............. 324/158 |
| 5,227,677 A | * | 7/1993 | Furman .................... 326/21 |
| 5,264,746 A | * | 11/1993 | Ohmea et al. ............. 326/93 |
| 5,307,381 A | | 4/1994 | Ahuja ..................... 375/107 |
| 5,396,198 A | * | 3/1995 | Yamashita et al. ......... 333/136 |
| 5,398,262 A | | 3/1995 | Ahuja ..................... 375/356 |
| 5,418,475 A | * | 5/1995 | Otaka ..................... 326/30 |
| 5,434,456 A | * | 7/1995 | Booth ..................... 307/109 |
| 5,504,782 A | * | 4/1996 | Campbell, Jr. ............ 375/259 |
| 5,546,023 A | | 8/1996 | Borkar et al. ............. 326/93 |
| 5,586,307 A | | 12/1996 | Wong et al. .............. 395/551 |
| 5,696,953 A | | 12/1997 | Wong et al. .............. 395/560 |
| 5,811,984 A | * | 9/1998 | Long et al. ............... 326/30 |
| 5,812,708 A | | 9/1998 | Rao ....................... 385/14 |
| 5,821,768 A | * | 10/1998 | Rau ....................... 326/31 |
| 6,081,162 A | * | 6/2000 | Johnson .................. 333/301 |

OTHER PUBLICATIONS

Rabaey; "Digital Integrated Circuits" Prentice Hall Electronics and VLSI Series.
Maliniak; "DAC attacks designer issues. (Design Automation Conference)(includes related articles)"; 1995; 13 total pages.
Kim et al.; "Characteristics of Integrated Dipole Antennas on Bulk, SOI, and SOS Substrates for Wireless Communications", IEEE; 1998; pp. 98–21, 98–23.
Deutsch et al.; "When are Transmission–Line Effects Important for On–Chip Interconnections?", IEEE; 1997; pp. 1836–1845.

* cited by examiner

Primary Examiner—Toan Tran
Assistant Examiner—Quan Tra
(74) Attorney, Agent, or Firm—Dickstein Shapiro Morin & Oshinsky, LLP

(57) ABSTRACT

An integrated circuit interconnection comprising a transmission line having a low characteristic impedance, and including a first end and a second end. A driver is coupled to the first end of the transmission line, and the transmission line is terminated with a current sense amplifier having an input impedance corresponding to the characteristic impedance of the transmission line. A plurality of components selected from the group consisting of capacitive elements, inductive elements and a combination of capacitive and inductive elements are connected at spaced intervals to the transmission line between the first and second ends.

54 Claims, 7 Drawing Sheets

INTEGRATED CIRCUIT AND METHOD FOR MINIMIZING CLOCK SKEWS

BACKGROUND OF THE INVENTION

1. Field of the Invention

The present invention relates to minimizing clock skews by current mode signals. More particularly, the present invention relates to minimizing clock skews by current mode signals and changing apparent line lengths and transmission time delays.

2. Discussion of the Related Art

Clock distribution is rapidly becoming one of the dominant design problems due to the increasing die sizes and clock frequencies, even for clock frequencies below 1 GHz. Since the speed of integrated circuits is expected to eventually reach above 10 GHZ, radically different on-chip interconnection and clock distribution schemes will be needed. Consideration has been given to both wireless and optical clock distribution. Wireless communication is described by K. Khong and K. O. Kenneth, "Characteristics of Integrated Dipole Antennas on Bulk, SOI and SOS Substrates for Wireless Communication", Int. Interconnect Technology Conf., San Francisco, Calif., Jun. 1998, pp. 21–23. Also, U.S. Pat. No. 5,812,708 discloses a method and apparatus for distributing an optical clock in an integrated circuit.

The problem with current techniques is that most clock distribution is achieved by voltage signals on RC lines and on capacitance dominated lines. As shown in FIGS. 1A and 1B, the delay ($t_{delay}$) in the clocking step signal ($v_{driver}(t)$) is limited by the RC time constant of the distribution line 20 if the line is high resistance polysilicon, or the RC time constant of the driver 22 output resistance and line capacitance if low resistance metal lines are used.

The delay is represented by the equation:

$$D = Zdrv\ C_T + (R1\ C1)/2$$

where $D$ = delay, $Zdrv$ = output impedance of the driver, $C_T$ = total capacitance seen by the driver, $R$ = resistance per unit length of the line of length, 1, and $C$ = capacitance per unit length of the line of length, 1.

Known techniques for minimizing clock skew are a tree type distribution system with buffers to drive short lines of equal length, and having all buffers on the same die as described in U.S. Pat. Nos. 5,586,307 and 4,860,322. Other known circuits include a daisy chain clock distribution network described in U.S. Pat. No. 5,546,023.

A circuit having lines of equal length is an H-tree distribution network illustrated in FIG. 2 for a 4×4 array of cells to provide lines of equal length. The H-tree network has the property that the clock signal is delayed by an equal amount for each sub-block because all blocks are equidistant from the clock source.

L. Maliniak in "DAC Attacks Designer Issues", Electronic Design, vol. 43, p. 66, Jun. 12, 1995, describes other techniques for minimizing clock skew and delays including making some lines wider than others to increase the capacitance to account for the shorter lengths. Further, U.S. Pat. No. 5,307,381 provides a technique which uses buffers or drivers with various delays designed to compensate for different RC time constant delays and/or delays with can be varied by programming.

At higher clock speeds the inductance of even low resistance lines becomes important because the rise time on the waveforms approaches the transit time down the line, or transmission line effects become important. See A. Deutsch et al, "When are Transmission-Line Effects Important for On-Chip Interconnections?", IEEE Trans. Microwave Theory and Techniques, vol. 45, no. 10, pp. 1836–1846, 1997.

Unfortunately such transmission lines use large voltage swings or voltage signaling, and cannot be terminated by a load resistor equal to the characteristic low impedance of the lines. As a result, reflections and ringing occurs which corrupts the clock signal. Also, large voltage signals and low impedance loads will result in excessive power consumption. See L. Maliniak, supra.

SUMMARY OF THE INVENTION

In accordance with the present invention, clock skew is avoided or at least minimized by changing the apparent length of transmission lines. The apparent length of a line is changed by adding capacitive and/or inductive elements to change the propagation constant and delay time of the line.

This is not the same technique as adding capacitance to RC dominated lines to change the time constant of the RC circuit. Adding capacitance to RC dominated lines serves to reduce the rise time or response time and further degrade the signal quality.

The capacitive and/or inductive elements are added in accordance with the present invention to change the propagation constant and delay time in the propagation of the signal down the line. Changing the delay time in this manner and by providing matched termination on the line cause the shape and quality of the signal to be maintained and only delays the signal in the time domain. In this manner the delay time along lines of different lengths are made to match and clock skews are eliminated or at least minimized. Conversely desired delays can be purposefully designed into the circuits to provide desired delay times between clocks and/or signals.

In accordance with the present invention, there is provided an integrated circuit interconnection comprising a transmission line having a low characteristic impedance, and including a first end and a second end. A driver is coupled to the first end of the transmission line, and the transmission line is terminated with a current sense amplifier having an input impedance corresponding to the characteristic impedance of the transmission line. A plurality of components selected from the group consisting of capacitive elements, inductive elements and a combination of capacitive and inductive elements are connected at spaced intervals to the transmission line between the first and second ends.

The combination of low characteristic impedance transmission lines terminated in their characteristic impedance and current sense amplifiers which can discriminate against noise will result in well defined signals with well defined delays.

As used herein, "low characteristic impedance" means less than 100 ohms, and preferably less than 50 ohms.

The above and other features and advantages of the invention will be more readily understood from the following detailed description which is provided in conjunction with the accompanying drawings.

DETAILED DESCRIPTION OF THE INVENTION

The following disclosure describes current mode signaling for clock distribution on low impedance transmission lines with matched terminations. Ringing and reflections on these lines are minimized and the delay on these lines is known and can be easily characterized. These lines can be shielded lines, shielded differential lines and/or shielded twisted pairs to reduce noise. Current sense amplifiers with hysteresis can be used to further discriminate against noise signals.

The combination of low impedance transmission lines terminated in their characteristic impedance and current sense amplifiers which can discriminate against noise will result in well defined signals with well defined delays.

Figure 1A:
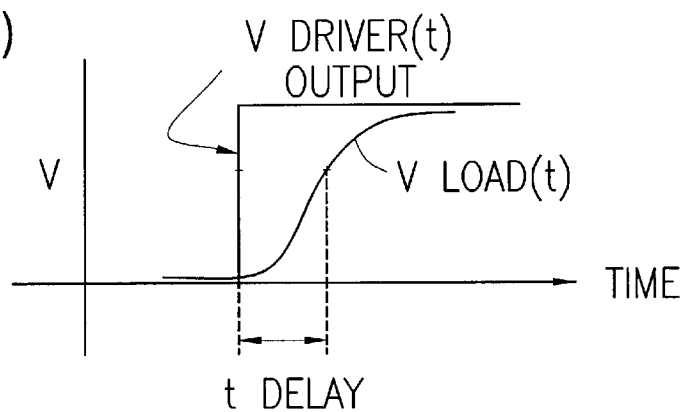
FIG. 1A is a graph plotting voltage against time to show the delay in the clocking step signal.
Figure 1B:
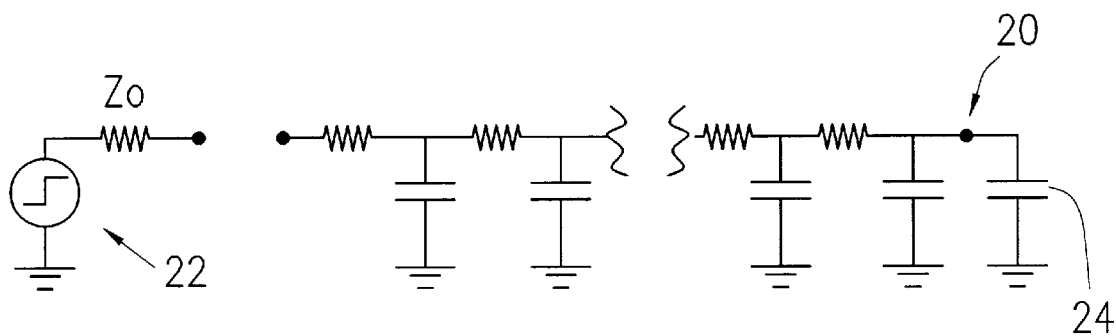
FIG. 1B is a schematic of a circuit showing the distribution on an R-C line of a clock signal emanating from an equivalent circuit of a driver having a voltage step signal output.
Figure 2:
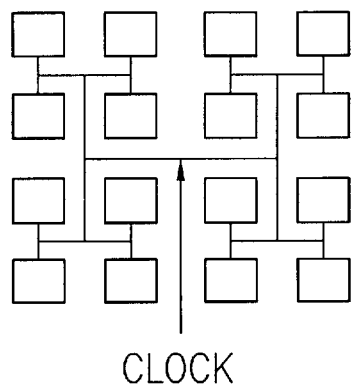
FIG. 2 is a schematic drawing of an H-tree distribution network having transmission lines of equal length.
Figure 3:
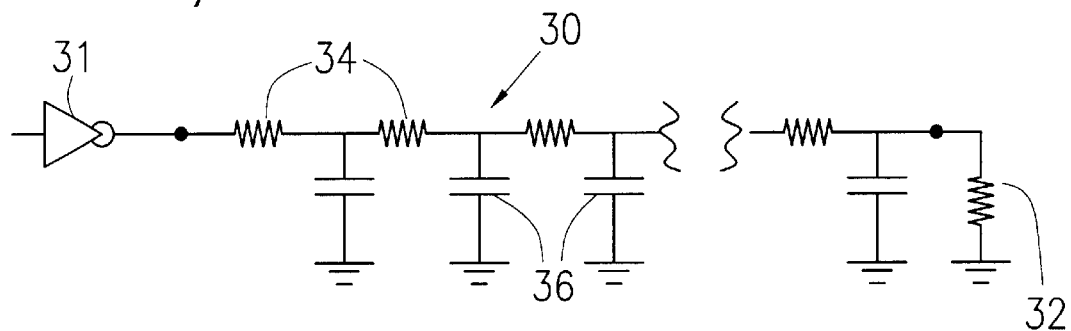
FIG. 3 shows an equivalent circuit of a transmission line with load equal to characteristic impedance.

FIG. 3 shows an equivalent circuit of a transmission line between a load 32 and a driver 31. The load 32 is equal to the characteristic impedance. The inductor symbols 34 in FIG. 3 represent inductance per unit length of the transmission line 30, and the capacitor symbols 36 represent capacitance, per unit length of the line 30. The delay on the line 30 is characterized by the propagation constant of the line in accordance with:

$$B = j w (LC)^{1/2}$$

where $B$ = propagation constant of line,
$L$ = inductance of line per unit length, and
$C$ = capacitance of line per unit length.

The transit time delay down the line of length is:

$$t_d = l/v$$

where $t_d$ = transit time delay
$l$ = length of line, and
$v$ = velocity of the signal = $1/(LC)^{1/2}$.

Clock skew could be avoided by having all lines of the same length. However, this would result in excessively long lines since all lines must be as long as the longest one required. It would also result in little flexibility in circuit designs.

Figure 4:
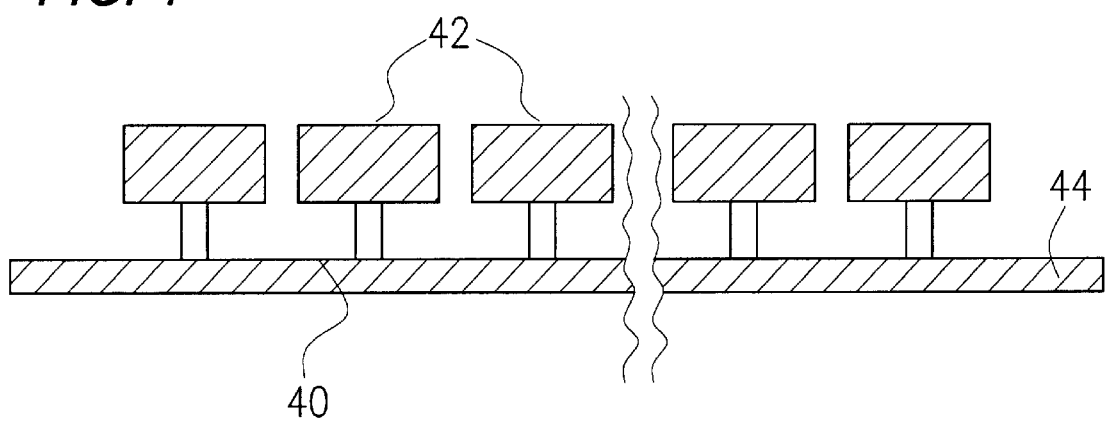
FIG. 4 is a top view of a transmission line substrate having capacitive and/or inductive elements added thereto.
Figure 5:
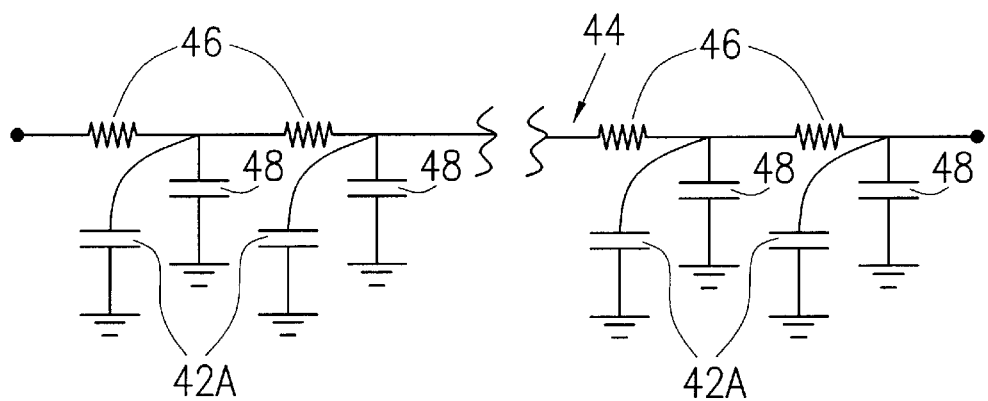
FIG. 5 is an equivalent circuit of the transmission line of FIG. 4 showing noded capacitive elements added to change the signal delay.

With reference to FIG. 4, the present invention provides for changing the apparent length of a transmission line 44 in a substrate 40 by adding capacitive and/or inductive elements 42 to alter the propagation constant and delay time of the line 44. FIG. 5 is an equivalent circuit of the transmission line 44 of FIG. 4 showing noded capacitive elements 42A added to change the signal delay. As discussed above with reference to FIG. 3, the inductor symbols 46 in FIG. 4 represent inductance per unit length of the transmission line 44, and the capacitor symbols 48 represent capacitance per unit length of the line 44.

Figure 6A:
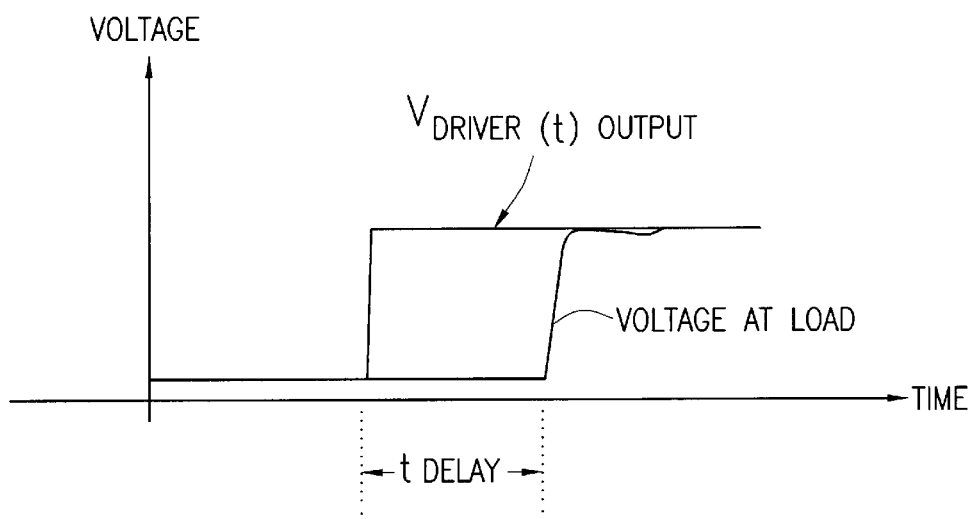
FIG. 6A is a graph plotting voltage against time and showing signal delay on a transmission line having matched termination.
Figure 6B:
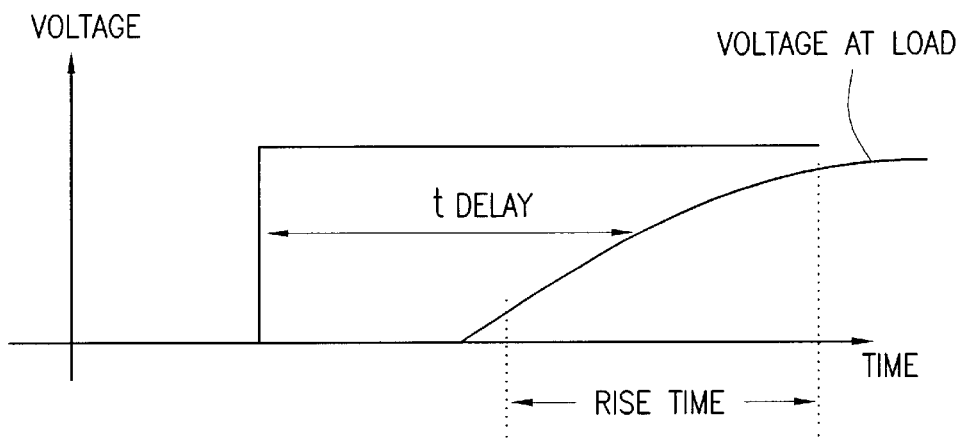
FIG. 6B is another graph plotting voltage against time and showing the signal on the R-C dominated distribution line wherein increasing capacitance of line further degrades rise time of the signal.

The addition of capacitive and/or inductive elements 42, as described with reference to FIGS. 4 and 5, is not the same technique as adding capacitance to RC dominated lines to change the time constant of the RC circuit. As shown in FIG. 6B, adding capacitance to a RC dominated line reduces the rise time or response time and further degrades the signal quality.

However, when the capacitive and/or inductive elements are added in accordance with the invention the propagation constant and delay time in propagation of the signal down the line are changed. Changing the delay time in this manner and also providing matched termination on the line function to preserve the shape and quality of the signal and only delays the signal in the time domain as shown in FIG. 6A. The delay time along lines of different lengths is thereby made to match and clock skews are eliminated or at least minimized. Also, desired delays can be designed into the circuits to provide planned delay times between clocks and/or signals.

Figure 7:
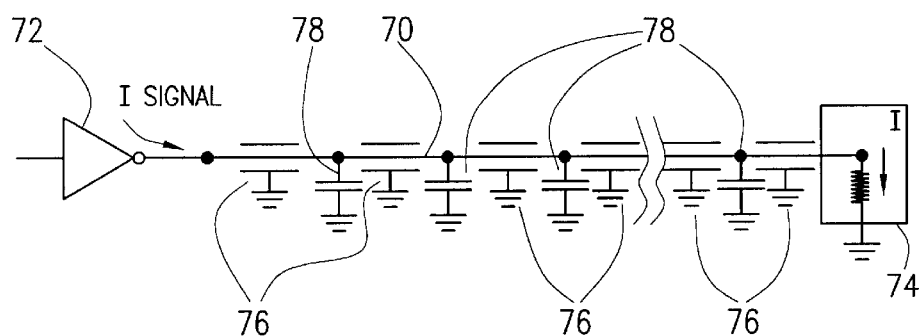
FIG. 7 is schematic of a transmission line showing current signal clock distribution with variable delay by added capacitive elements in accordance with the present invention.

With reference to FIG. 7, there is shown a schematic drawing of a transmission line 70 between a driver 72 and a current sense amplifier 74. A plurality of interconnection (transmission) lines 76 are provided along the transmission line 70. Current mode signaling is used on lines which normally have a low characteristic impedance on integrated circuits. These lines are terminated in their characteristic impedance to reduce ringing and reflections. A plurality of capacitive elements 78 are connected at spaced intervals to the transmission line 70 to vary clock signal delay times in accordance with the present invention.

The illustration of FIG. 7 shows the capacitive elements 78 as extensions of the interconnection metal wiring. The desired capacitance of elements 42 (FIG. 4), 42A (FIG. 5) and 78 (FIG. 7) can also be provided by the gate capacitances of field effect transistors (FETs) where the FETs are used as capacitors. Specialized capacitive structures such as metal-metal, metal-polysilicon or polysilicon-polysilicon capacitors are also suitable.

As noted above with reference to at least FIG. 4, clock signal delay times can also be varied by adding inductive elements in series to the line 44. If inductors are introduced into the series path they can be implemented as spiral inductors. Also, the self inductance of the line 44 can be increased by the deposition of materials with a higher magnetic permeability.

Figure 8:
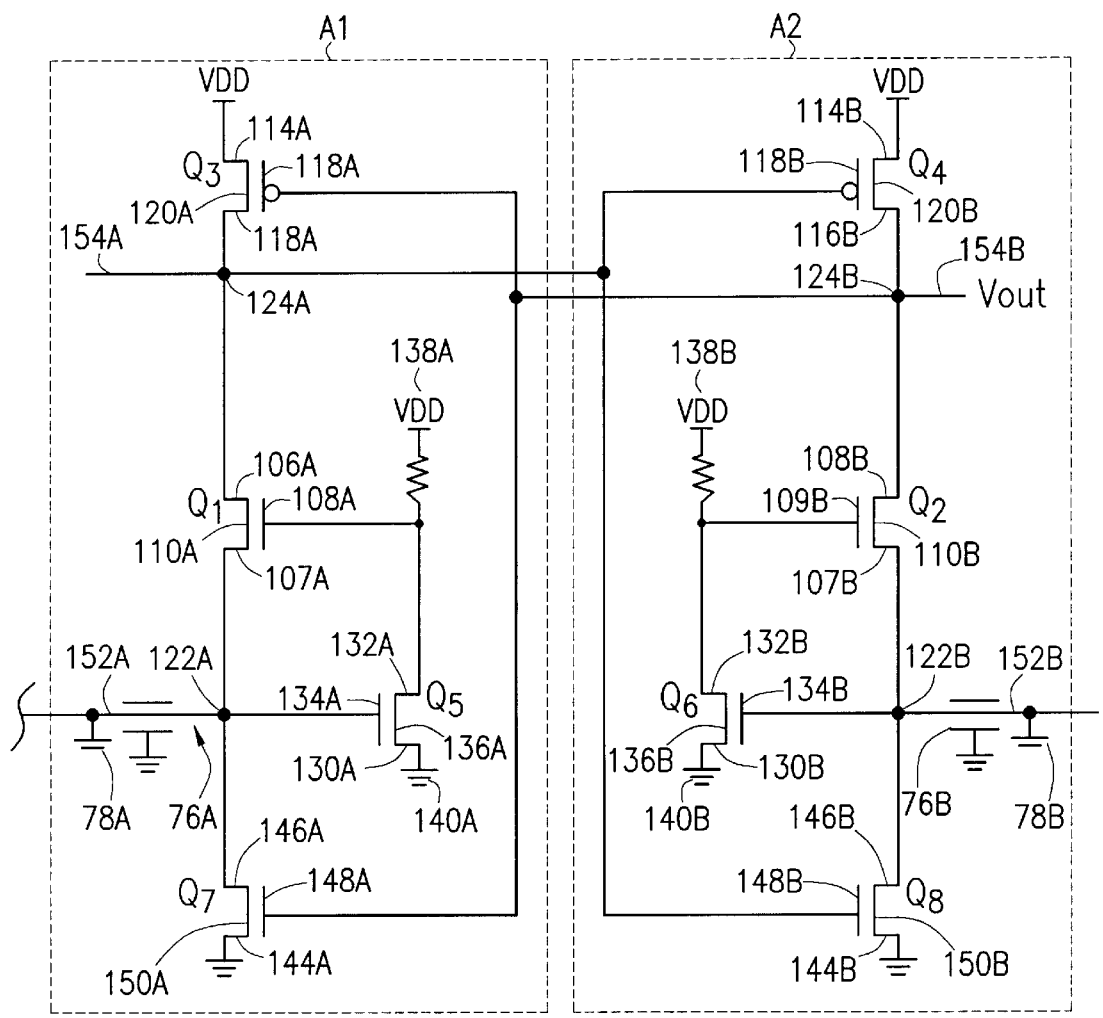
FIG. 8 is a schematic diagram illustrating an embodiment of the invention with a differential amplifier.

With reference to FIG. 8, there is shown a differential receiver designed for current signaling in order to better impedance match high speed low impedance transmission lines. Low impedance transmission lines such as those which exist on CMOS integrated circuits are more amenable to current signaling over longer transmission lines. The receiver employs feedback to decrease the input impedance of the receiver. The receiver of the present invention can match the low impedance of transmission lines while keeping the sizes of devices small and the power dissipation low.

FIG. 8 illustrates a pair of cross coupled complementary metal oxide semiconductor (CMOS) amplifiers, A1 and A2 for coupling with interconnection (transmission) lines 152A, 152B. Each amplifier, A1 and A2, includes a first transistor, Q1 and Q2 respectively, of a first conductivity type. Each first transistor Q1 and Q2 includes a source region, 107A and 107B, respectively, a drain region, 108A and 107B, and a gate, 109A and 109B, opposing a body region 110A and 110B. Each amplifier, A1 and A2, includes a second transistor Q3 and Q4 of a second conductivity type. Each second transistor Q3 and Q4 includes a source region, 114A and 114B, respectively, a drain region, 116A and 116B and a gate, 118A and 118B, opposing a body region 120A and 120B. In one embodiment, each first transistor, Q1 and Q2, of the first conductivity type includes an n-channel metal-oxide semiconductor (NMOS) transistor. In this embodiment, each second transistor, Q3 and Q4, of the second conductivity type includes a p-channel metal-oxide semiconductor (PMOS) transistor.

A plurality of interconnection (transmission) lines 76A, 76B are provided along transmission lines 152A, 152B. A plurality of capacitive elements 78A, 78B are connected at spaced intervals along the transmission lines 152A, 152B to vary clock signal delay times as described above with reference to FIG. 7.

As shown in FIG. 8, each amplifier in the pair of cross coupled amplifiers A1 and A2 includes a signal input node, 122A and 122B, coupled to the source region 107A and 107B for the first transistor Q1 and Q2. A signal output node 124A and 124B is coupled to the drain regions 108A and 107B of the first transistors Q1 and Q2 as well as to the drain regions 116A and 116B of each second transistor Q3 and Q4.

Further, a third transistor, Q5 and Q6, respectively, is included in each of the amplifiers A1 and A2. Each third transistor, Q5 and Q6, includes a source region, 130A and 130B respectively, a drain region, 132A and 132B, and a gate, 134A and 134B, opposing a body region 136A and 136B. The gate, 134A and 134B, of each third transistor, Q5 and Q6, is coupled to the signal input node, 122A and 122B, for each amplifier in the pair of cross coupled amplifiers A1 and A2. The drain region 132A and 132B for each third transistor Q5 and Q6 is coupled to a positive voltage supply, 138A and 138B. The source region 130A and 130B for each third transistor Q5 and Q6 is coupled to a lower potential, 140A and 140B. The drain region 132A and 132B for each third transistor Q5 and Q6 is additionally coupled to the gate 109A and 109B for each first transistor Q1 and Q2.

In the embodiment shown in FIG. 8, each amplifier, A1 and A2, includes a fourth transistor, Q7 and Q8 respectively, of the first conductivity type. Each fourth transistor Q7 and Q8 includes a source region, 144A and 144B respectively, a drain region, 146A and 146B, and a gate, 148A and 148B, opposing a body region 150A and 150B. The drain region 146A and 146B for each fourth transistor, Q7 and Q8, is coupled to the signal input node, 122A and 122B, for each amplifier in the pair of cross coupled amplifiers A1 and A2.

In one embodiment of the circuit of FIG. 8, the signal output node 124A for first amplifier A1 is cross coupled to the gates 118B and 148B for the second transistor Q4 and the fourth transistor Q8 of the second amplifier A2. Similarly, the signal output node 124B for second amplifier A2 is cross coupled to the gates 118A and 148A for the second transistor Q3 and the fourth transistor Q7 of the first amplifier A1.

Each signal input node, 122A and 122B, for each amplifier in the pair of cross coupled amplifiers A1 and A2 is coupled to an input transmission line, 152A and 152B respectively, which has a length of at least 500 micrometers ($\mu$m), but may have a length of at least 1000 micrometers ($\mu$m). In one embodiment, each signal input node, 122A and 122B, is coupled to the input transmission line 152A and 152B which has a characteristic impedance (Zo) of less than 50 Ohms. In another embodiment, each signal input node, 122A and 122B, in the pair of cross coupled amplifiers A1 and A2 is coupled to an input transmission line 152A and 152B which has a characteristic impedance (Zo) of less than 75 Ohms. Preferably, each signal input node, 122A and 122B has an input impedance (Zin) which matches the characteristic impedance (Zo) of the transmission line 152A and 152B.

Figure 9:
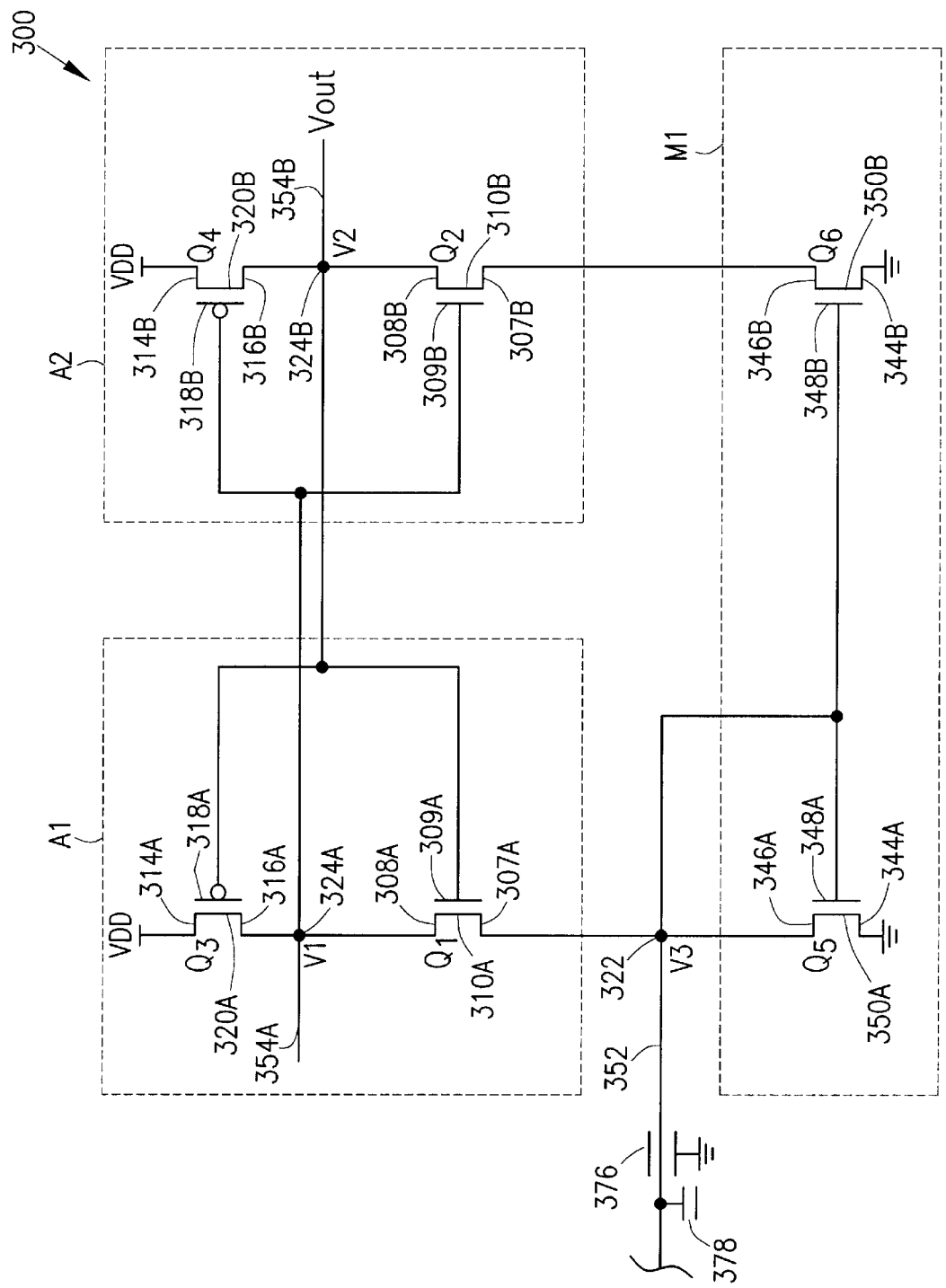
FIG. 9 is a schematic diagram illustrating an embodiment of the invention with a pseudo differential amplifier circuit (or pseudo differential latch or single ended receiver)

FIG. 9 shows another embodiment of the invention having a "pseudo-differential" amplifier 300. The amplifier 300 is coupled to interconnection (transmission) lines 352. A plurality of interconnection (transmission) lines 376 are provided along the transmission line 352. A plurality of capacitive elements 378 are connected at spaced intervals along the transmission line 352 to vary clock signal delay times as described above with reference to FIG. 7.

As used herein, "pseudo-differential amplifier" means an amplifier circuit wherein a single transmission line interconnection is used, and one input of the voltage sense amplifier is driven with a reference potential. The pseudo differential amplifier includes a single signal input node coupled to the single transmission line interconnections, and a pair of signal output nodes, whereby the amplifier is able to convert a single ended input current received at the single signal input node into a differential input signal.

Unfortunately, achieving high data rates is difficult with prior art circuits having single-ended or unbalanced signal transmission lines at high frequencies because of large amount of noise is generated in the interconnection system including crosstalk and radiation in backplanes, connectors and cables. The amplifier of FIG. 9 has a single signal input node which is coupled to a source region for one of the transistors in the pair of cross coupled transistors and to a current mirror such that the pseudo differential amplifier is able to convert a single ended input current received at the single signal input node into a differential input signal.

FIG. 9 is a schematic diagram which illustrates a pseudo differential amplifier circuit (or pseudo differential latch, or single ended receiver) 300. FIG. 9 illustrates a pair of cross coupled amplifiers, A1 and A2. The pair of cross coupled amplifiers, A1 and A2, comprise two cross coupled inverters. Each amplifier, A1 and A2, includes a first transistor, Q1 and Q2, respectively, of a first conductivity type. Each first transistor Q1 and Q2 includes a source region, 307A and 307B, respectively, a drain region, 308A and 308B, and a gate, 309A and 309B, opposing a body region 310A and 310B. Each amplifier, A1 and A2, includes a second transistor Q3 and Q4 of a second conductivity type. Each second transistor Q3 and Q4 includes a source region, 314A and 314B, respectively, a drain region, 316A and 316B, and a gate, 318A and 318B, opposing a body region 320A and 320B. In an embodiment, each first transistor, Q1 and Q2, of the first conductivity type includes a metal oxide semiconductor field effect transistor (MOSFET). In another embodiment, each first transistor, Q1 and Q2, of a first conductivity type includes an n-channel metal-oxide semiconductor (NMOS) transistor. In one embodiment, each second transistor, Q3 and Q4, of the second conductivity type includes a metal oxide semiconductor field effect transistor (MOSFET). Alternatively, each second transistor, Q3 and Q4, of the second conductivity type includes a p-channel metal-oxide semiconductor (PMOS) transistor. The NMOS and PMOS transistors are fabricated according to a complementary metal oxide semiconductor (CMOS) process technology.

In FIG. 9, the single signal input node 322 is coupled to the source region, 307A or 307B, for one of the first transistors, Q1 and Q2, in the pair of cross coupled amplifiers A1 and A2. By way of illustration, FIG. 9 shows the single signal input node 322 coupled to the source region 307A of transistor Q1. A signal output node 324A and 324B in each inverter A1 and A2 is coupled to the drain regions 308A and 308B of the first transistors Q1 and Q2 as well as to the drain regions 316A and 316B of each second transistor Q3 and Q4. The signal output nodes 324A and 324B in each one of the cross coupled inverters A1 and A2 is further coupled to the gates of the first and the second transistors in the other inverter. Hence, signal output node 324A is coupled to gates 309B and 318B of inverter A2, and signal output node 324B is coupled to gate 309A and 318A of inverter A1. In one embodiment, the signal output nodes 324A and 324B are coupled respectively to a pair of output transmission lines 354A and 354B. The single signal input node 322 is additionally coupled to a current mirror MI. In one embodiment, the transmission line 352 which has a characteristic impedance (Zo) of less than 50 Ohms is coupled to the signal input node 322.

In FIG. 9, a third transistor, Q5 and Q6 respectively, of a first conductivity type is coupled to each amplifier, A1 and A2. Each third transistor includes a source region, 344A and 344B respectively, a drain region, 346A and 346B, and a gate, 348A and 348B, opposing a body region 350A and 350B. The drain region 346A and 346B for each third transistor, Q5 and Q6, is coupled to the source region, 307A and 307B, for each first transistor Q1 and Q2 in the pair of cross coupled amplifiers A1 and A2. The single signal input node 322 additionally couples to the gate, 348A and 348B, for each third transistor Q5 and Q6. In one embodiment, each third transistor, Q5 and Q6, of a first conductivity type comprise a second pair of MOSFETs of a first conductivity type for the pseudo differential amplifier circuit 300. In this embodiment, the second pair of MOSFETs of first conductivity type includes a pair of NMOS transistors Q5 and Q6. Also in this embodiment, the pair of NMOS transistors Q5 and Q6 are part of the current mirror M1. Here, a drain region, 346A and 346B, for each one of the pair of NMOS transistors Q5 and Q6 in the current mirror M1 is coupled to a source region, 307A and 307B respectively, for each NMOS transistor Q1 and Q2 in the pair of cross coupled inverters A1 and A2. The single signal input node 322 is coupled a gate on each one of the pair of NMOS transistors Q5 and Q6 in the current mirror M1.

The pseudo differential amplifier circuit of FIG. 9 eliminates a special problem in the prior art which requires two input signals by facilitating differential sensing capability using a single ended receiver. This solution is achieved as follows. With reference to FIG. 9, the current mirror M1 converts a single ended input current received at the single signal input node 322 into a differential input signal.

For example, output node 324A and 324B are precharged to a voltage potential prior to the sensing operation. Next, a current signal is input from input transmission line 352 into single signal input node 322. When the current signal arrives at single signal input node 322 a portion of the signal flows into the gates 348A and 348B for transistors Q5 and Q6 serving to turn "on" these transistors. This creates conduction between source region 344A and drain region 346A of transistor Q5 as well as between source region 344B and drain region 346B of transistor Q6. If the input current signal flows into the drain region 346A of transistor Q5 then some current will also flow into the source region 307A of transistor Q1. The current flowing into the source region 307A of transistor Q1 will decrease the current flowing out of the drain region 316A of transistor Q3 and out of the source region 307A of transistor Q1. The precharged voltage potential, or node voltage V1, at output node 324A will subsequently increase which serves to turn transistor Q2 on and turn off transistor Q4. At the same time, an increase in the conduction between source region 344A and drain region 346A in transistor Q5 will cause the potential, or node voltage V3, at the signal input node 322 to increase which in turn increases the voltage on gate 348B of transistor Q6. An increasing gate voltage on transistor Q6 will further turn on transistor Q6 such that transistor Q6 conducts more current through transistor Q6 between drain region 346B and source region 344B. This increase in conduction through transistor Q6 will tend to cause the current flowing out of the source region 307B of transistor Q2 to increase. The increased conduction through transistors Q2 and Q6 tend to pull signal output node 324B to ground reducing the node voltage V2 at signal output node 324B. As the node voltage V2 of signal output node 324B is reduced, transistor Q3 is further turned on. In this manner, the single ended receiver, or pseudo differential amplifier circuit 300 operates in a differential amplifier fashion. The single ended current signal which was input from transmission line 352 into signal input 322 is thus converted into a differential current signal in that the source current at source region 307A of transistor Q1 tends to decrease and the source current at source region 307B of transistor Q2 tends to increase. As a result, the pseudo differential amplifier of FIG. 9 produces the same effect that a fully differential signal would have on a conventional differential current sense amplifier.

Also, the pseudo differential amplifier avoids the necessity having two transmission lines as in a conventional differential current sense amplifier. The pseudo differential amplifier circuit 300 can latch a voltage output signal on the pair of signal output nodes, 324A and 324B, and the pair of output transmission lines 354A and 354B when a single sided current signal of 2.0 mA or less is received at the single signal input node 322. The pseudo differential amplifier circuit 300 can latch this voltage output signal to the pair of signal output nodes, 324A and 324B in less than 300 nanoseconds (ns). This is a very rapid response time and is on a par with that provided by conventional differential current sense amplifiers. Further, the pseudo differential amplifier circuit described here is fully capable of fabrication in a streamlined CMOS process.

Figure 10:
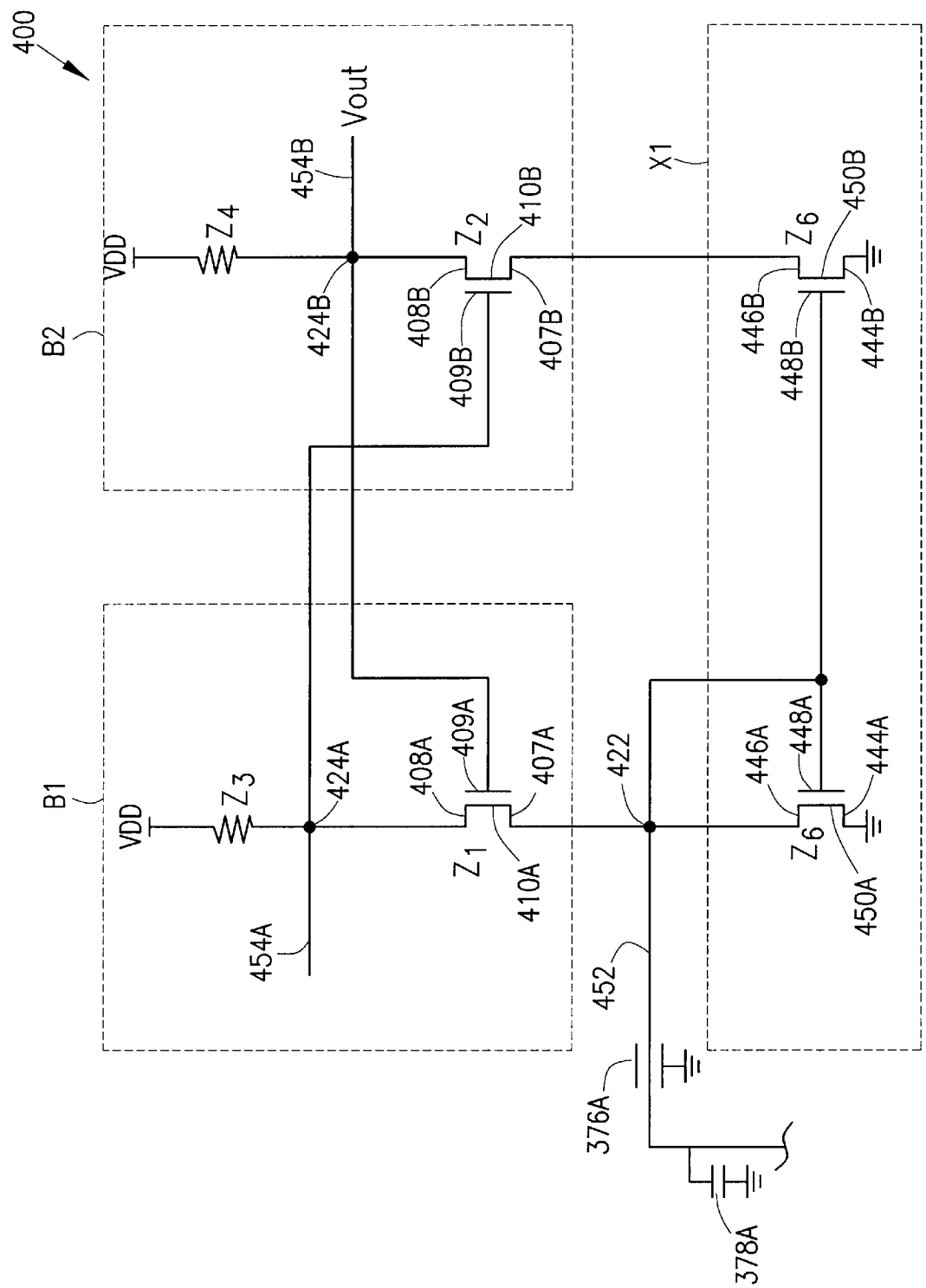
FIG. 10 is a schematic diagram illustrating an embodiment of the invention with a pseudo differential current sense amplifier circuit.

FIG. 10 is a schematic diagram illustrating another pseudo differential current sense amplifier circuit, or single ended amplifier 400. The amplifier 400 is coupled to transmission line 452. A plurality of interconnection (transmission) lines 376A are provided along the transmission line 452. A plurality of capacitive elements 378A are connected at spaced intervals along the transmission line 452 to vary clock signal delay times as described above with reference to FIG. 7.

The pseudo differential amplifier circuit 400 of FIG. 10 is useful in amplifier roles which do not require a latching action. FIG. 10 illustrates a pair of cross coupled amplifiers, B1 and B2. Each amplifier, B1 and B2, includes a first transistor, Z1 and Z2, respectively, of a first conductivity type. Each first transistor Z1 and Z2 includes a source region, 407A and 407B, respectively, a drain region, 408A and 408B, and a gate, 409A and 409B, opposing a body region 410A and 410B. Each amplifier, B1 and B2, includes a load resistor Z3 and Z4. Each load resistor Z3 and Z4 is coupled to the drain region for each one of the first transistors Z1 and Z2 respectively in the pair of cross coupled amplifiers B1 and B2. In one embodiment, each first transistor, Z1 and Z2, of a first conductivity type includes a pair of metal oxide semiconductor field effect transistors (MOSFET). Alternatively, each first transistor, Z1 and Z2, of the first conductivity type includes an n-channel metal-oxide semiconductor (NMOS) transistor.

In FIG. 10, a single signal input node 422 is coupled to the source region, 407A or 407B of one of the first transistors, Z1 and Z2, in the pair of cross coupled amplifiers A1 and A2. By way of illustration, FIG. 10 shows the single signal input node 422 coupled to the source region 407A of transistor Z1. A signal output node 424A and 424B in each amplifier in the pair of cross coupled amplifiers B1 and B2 is coupled to the drain regions 408A and 408B of the first transistors Z1 and Z2 as well as to the load resistors Z3 and Z4. The signal output nodes 424A and 424B in each one of the cross coupled amplifiers B1 and B2 is further coupled to the gate of the first transistor in the other amplifier. Hence, signal output node 424A is coupled to gate 409B of amplifier B2, and signal output node 424B is coupled to gate 409A of amplifier B1. In one embodiment, the signal output nodes 424A and 424B are coupled respectively to a pair of output transmission lines 454A and 454B. The single signal input node 422 is additionally coupled to a current mirror X1. In one embodiment, the transmission line 452 which has a characteristic impedance (Zo) of less than 50 Ohms is coupled to the signal input node 422.

In FIG. 10, a second transistor, Z5 and Z6 respectively, of a first conductivity type is coupled to each amplifier, B1 and B2. Each second transistor Z5 and Z6 includes a source region, 444A and 444B respectively, a drain region, 446A and 446B, and a gate, 448A and 448B, opposing a body region 450A and 450B. The drain region 446A and 446B for each second transistor, Z5 and Z6, is coupled to the source region, 407A and 407B, for each first transistor Z1 and Z2 in the pair of cross coupled amplifiers A1 and A2. The single signal input node 422 additionally couples to the gate, 448A and 448B, for each second transistor Z5 and Z6. Alternatively, each second transistor Z5 and Z6, of a first conductivity type comprise a second pair of MOSFETs of a first conductivity type for the pseudo differential amplifier circuit 400. In this embodiment, the second pair of MOSFETs of a first conductivity type includes a pair of NMOS transistors Z5 and Z6. Also in this embodiment, the pair of NMOS transistors Z5 and Z6 are part of the current mirror X1. Here, a drain region, 446A and 446B, for each one of the pair of NMOS transistors Z5 and Z6 in the current mirror X1 is coupled to a source region, 407A and 407B respectively, for each NMOS transistor Z1 and Z2 in the pair of cross coupled amplifiers B1 and B2. The single signal input node 422 is coupled to a gate on each one of the pair of NMOS transistors Z5 and Z6 in the current mirror X1.

The operation of the pseudo differential amplifier circuit 400 in FIG. 10 is analogous to the operation of the pseudo differential amplifier circuit 300 in FIG. 9. The pseudo differential amplifier circuit 400 conserves chip surface area by facilitating differential sensing capability using a single ended receiver. In the pseudo differential amplifier circuit 400 shown in FIG. 10 the amplifier action of the upper transistors Q3 and Q4 shown in FIG. 9 have been replaced by load resistors Z3 and Z4. The use of load resistors Z3 and Z4 rather than active transistors Q3 and Q4 as load devices results in a lower gain, slower response and more input current being required to achieve latching action if such is desired. Nonetheless, the pseudo differential amplifier circuit 400 is very well suited to and responsive in an amplifying signal detection role. The pseudo differential amplifier circuit 400 can provide a differential voltage signal to the pair of signal output nodes 424A and 424B and the pair of output transmission lines 454A and 454B when a single ended input current of less than 1.0 mA is received at the single signal input node 422. The pseudo differential amplifier circuit 400 can provide the differential voltage signal to the pair of signal output nodes in less than 300 nanoseconds (ns). This is a very rapid response time and is on par with that provided by conventional differential current sense amplifiers. The pseudo differential amplifier circuit 400 is fully capable of fabrication in a streamlined CMOS process. Further, since the pseudo differential amplifier circuit 400 operates with only a single signal input node and single input transmission line, precious chip surface area is conserved.

Figure 11A:
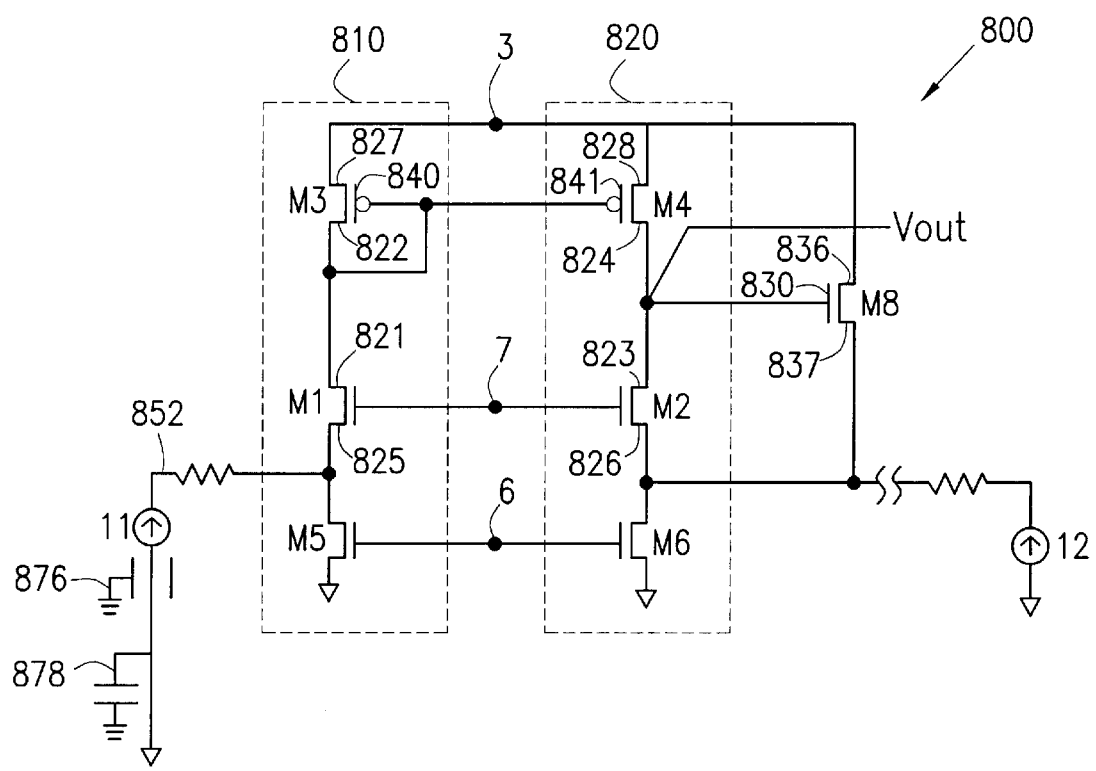
FIG. 11A shows a schematic drawing of an embodiment of the invention which includes a current sense amplifier with hysteresis.
Figure 11B:
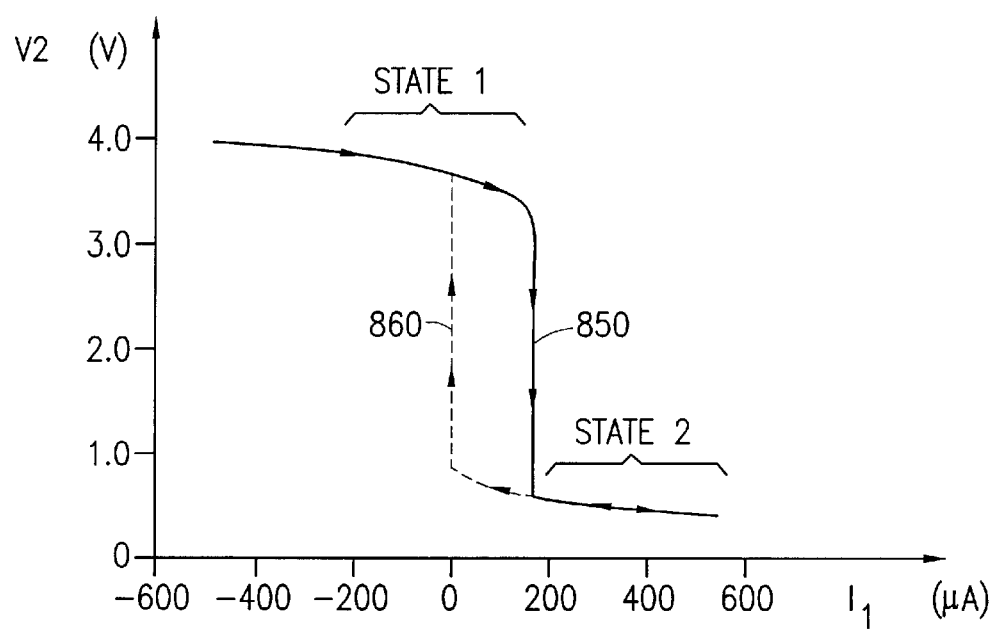
FIG. 11B is a graph illustrating the operation of the current sense amplifier of FIG. 11A.

With reference to FIGS. 11A and 11B, there is shown a current sense amplifier (or current comparator) 800 with hysteresis fabricated according to CMOS process technology. The amplifier 800 is coupled to a transmission line 852. A plurality of interconnection (transmission) lines 876 are provided along the transmission line 852. A plurality of capacitive elements 878 are connected at spaced intervals along the transmission line 852 to vary clock signal delay times as described above with reference to FIG. 7.

The introduction of hysteresis into the current sense amplifiers and/or receivers will allow them to discriminate against noise transients since the output will not change states unless the signal becomes more positive than a high trip point, or more negative than a low trip point.

The current sense amplifier 800 includes a first amplifier 810, and a second amplifier 820. Each amplifier, 810 and 820, includes a first transistor of a first conductivity type, M1 and M2 respectively. Each amplifier, 810 and 820, includes a second transistor of a second conductivity type, M3 and M4 respectively. The first transistor of a first conductivity type, M1 and M2, includes an n-channel metal oxide semiconductor (NMOS) transistor, M1 and M2. In this embodiment, the second transistor of a second conductivity type, M3 and M4, includes a p-channel metal oxide semiconductor (PMOS) transistor, M3 and M4. Transistors M1 and M2 are driven by a gate potential at node 7. Each amplifier, 810 and 820, includes a current sink, shown in FIG. 11A as transistors M5 and M6 which are driven by a gate potential at node 6. The first and second transistors, M1 and M3, of the first amplifier 810 are coupled at a drain region, 821 and 822 respectively, to node 1.

Node 1 couples the drain region, 821 and 822, for the first and the second transistor, M1 and M3, in the first amplifier 810 to gates, 840 and 841, of the second transistor, M3 and M4, in the first and the second amplifier 810 and 820. The first and second transistors, M2 and M4, of the second amplifier 820 are coupled at a drain region, 823 and 824 respectively. In the embodiment shown in FIG. 11A, a signal output node 2 is coupled to the drain region, 823 and 824, of the first and the second transistor, M2 and M4, in the second amplifier 820. In an alternative embodiment, the signal output node 2 can be coupled to the drain region, 821 and 822, of the first and the second transistor, M1 and M3, in the first amplifier 810. As shown in FIG. 11A the signal output node is further coupled to a gate 880 of a third transistor M8. In one embodiment, the third transistor M8 is an n-channel metal oxide semiconductor (NMOS) transistor M8. Each amplifier, 810 and 820, includes a signal input node, 5 and 4 respectively, which is coupled to a source region, 825 and 826, of the first transistor, M1 and M2.

A source region, 827 and 828, for the second transistor, M3 and M4 respectively, in the first and second amplifier, 810 and 820, is coupled to a voltage supply Vdd at node 3. In one embodiment, a drain region 836 of the third transistor M8 is coupled to a source region 828 of the second transistor M4 in the second amplifier 820. In this embodiment, a source region 837 of the third transistor M8 is coupled to the signal input node 4 of the second amplifier 820. The signal input node 5 of the first amplifier 810 receives an input current, I1, and the signal input node 4 of the second amplifier 820 receives a reference current, I2.

FIG. 11B is an I–V graph illustrating the operation of the current sense amplifier circuit 800 shown in FIG. 11A. The operation of the current sense amplifier circuit 800 is explained by reference to FIGS. 11A and 11B. The third transistor M8 introduces a controlled hysteresis into the current sense amplifier 800 of FIG. 11A. Beginning at the left hand side of the graph, FIG. 11B illustrates the output voltage, V2, at a high state output voltage. The high state output voltage, V2, turns on third transistor M8 which then drives an input current, IM8, into node 4. In other words, the third transistor M8 provides an input current, IM8, into node 4 which acts in conjunction with the reference current I2. The single ended input current, I1, must overcome this combination of the reference, or differential current, I2, and the input current, IM8, before the output voltage, V2, can change states. At this point, the switching action of the output voltage, V2, of the current sense amplifier 800 is given by V2=−Zv(I1−(I2+IM8)). The value of (I1−(I2+IM8)) must become non zero or positive for the output to switch, or go to the second state, e.g. low state. Due to the input current IM8, I1 will not "trip" the state of the current sense amplifier 800 until I1 exceeds a certain positive current value, i.e. a high trip point, shown at 850 in FIG. 11B. The size and doping levels of the third transistor M8 can be varied to provide a set magnitude of input current, IM8, into node 4. In this manner, the circuit design of the current sense amplifier 800 can be manipulated to introduce a range of hysteresis for positive input current, I1, values into the current sense amplifier 800. The set hysteresis introduced, by the addition of the third transistor M8, allows the current sense amplifier 800 to discriminate against small transient noise values which would otherwise cause the current sense amplifier to switch states prematurely and provide an inaccurate output voltage, V2.

In reverse operation, the single ended input current, I1, is decreased from a higher positive value, e.g. above trip point value 850. As shown in FIG. 11B, while the input current, I1, is above trip point 850 the output voltage, V2, will be at a low state output voltage. In this low state, the voltage potential applied to gate 880 of the third transistor M8 will not turn "on" transistor M8. Thus, the third transistor M8 is effectively removed from the current sense amplifier circuit 800. In the embodiment of FIGS. 11A and 11B, node 4 will only see a reference current, I2, here held at zero amperes. In other words, the third transistor is not providing any input current, IM8, into node 4. In reverse operation, the single ended input current, I1, must again upset the balance of the current sense amplifier 800, but in the opposite direction, e.g. the input current, I1, must overcome the reference or differential current, I2, of zero amperes before the output voltage, V2, will again change states. At this point, the output voltage, V2, of the current sense amplifier 800 is given by V2=−Zv(I1−I2). In this reverse direction, (I1−I2) must become negative for the output voltage, V2, to switch back, or return to the high state output voltage. I1 will not "trip" the state of the current sense amplifier 800 until I1 passes below a second current value, i.e. a low trip point, shown at 860 in FIG. 11B. In the embodiment shown in FIGS. 11A and 11B, the output voltage, V2, will not change states until I1 has reached zero. Other high and low trip points can be achieved by varying the amount of hysteresis introduced by the third transistor M8 and/or by varying the differential/reference signal I2 of the current sense amplifier 800.

Although the present invention has been described with reference to preferred embodiments, it is to be understood that modifications and variations may be made without departing from the spirit and scope of this invention, as those skilled in the art will readily understand. All such modifications and variations are considered to be part of the invention. Accordingly, the invention is not limited by the foregoing description, but is only limited by the scope of the appended claims.

What is claimed is:

1. An integrated circuit interconnection comprising:
    a plurality of transmission lines;
    at least one of said transmission lines having a characteristic impedance less than 100 Ohms, said at least one transmission line including a first end and a second end;
    a driver coupled to the first end of said at least one transmission line;
    a termination circuit at the second end of said at least one transmission line having an impedance corresponding to the characteristic impedance of said transmission line; and
    a plurality of components selected from the group consisting of capacitive elements, inductive elements and a combination of capacitive and inductive elements, said components being connected at spaced intervals to said at least one transmission line between said first and second ends to change an apparent length of said at least one transmission line to match with at least one other of said plurality of transmission lines.

2. The integrated circuit interconnection of claim 1 wherein said components change the propagation constant and delay time of said transmission line.

3. The integrated circuit interconnection of claim 1 wherein said components are a plurality of capacitive elements.

4. The integrated circuit interconnection of claim 1 wherein said components are a plurality of inductive elements.

5. The integrated circuit interconnection of claim 1 wherein said components are a combination of capacitive and inductive elements.

6. The integrated circuit interconnection of claim 1 wherein said transmission line has a characteristic impedance of less than 50 Ohms.

7. The integrated circuit interconnection of claim 1 wherein said termination circuit comprises a current sense amplifier coupled to the second end of said at least one transmission line.

8. The integrated circuit interconnection of claim 1 wherein a plurality of interconnection lines are connected to said at least one transmission line.

9. The integrated circuit interconnection of claim 3 wherein said capacitive elements are selected from the group consisting of metal-metal, metal-polysilicon and polysilicon-polysilicon capacitors.

10. The integrated circuit interconnection of claim 1 wherein said capacitive elements are gate capacitances of field effect transistors used as capacitors.

11. The integrated circuit interconnection of claim 1 wherein said inductive elements are spiral inductors serially implanted in said at least one transmission line.

12. The integrated circuit interconnection of claim 1 wherein said inductive elements are formed by depositing material with a higher magnetic permeability on said at least one transmission line for increasing self inductance of said at least one transmission line.

13. The integrated circuit interconnection of claim 1 wherein said termination circuit is formed in complementary metal-oxide semiconductor (CMOS) technology on the second end of said at least one transmission line.

14. The integrated circuit interconnection of claim 7 wherein said current sense amplifier has an input impedance of less than 50 Ohms.

15. The integrated circuit interconnection of claim 1 wherein said termination circuit comprises a differential receiver coupled to the second end of said at least one transmission line.

16. The integrated circuit interconnection of claim 1 wherein said termination circuit comprises an amplifier circuit comprising a pair of cross coupled CMOS amplifiers coupled to the second end of said at least one transmission line.

17. An integrated circuit interconnection comprising:
a transmission line having a characteristic impedance less than 100 Ohms, said transmission line including a first end and a second end;
a driver coupled to the first end of said transmission line;
a termination at the second end of said transmission line having an impedance corresponding to the characteristic impedance of said transmission line; and
a plurality of components selected from the group consisting of capacitive elements, inductive elements and a combination of capacitive and inductive elements, said components being connected at spaced intervals to said transmission line between said first and second ends to change an apparent length of said transmission line, wherein said termination circuit comprises an amplifier circuit coupled to the second end of the transmission line, wherein said termination circuit comprises an amplifier circuit comprising a pair of cross coupled CMOS amplifiers coupled to the second end of the transmission line, and wherein each amplifier comprises:
a first transistor of a first conductivity type having a source region, a drain region, and a gate opposing a body region;
a second transistor of a second conductivity type having a source region, a drain region, and a gate opposing a body region;
a signal input node coupled to the source region for the first transistor;
a signal output node coupled to the drain regions for the first transistor and the second transistor; and
a third transistor of a first conductivity type having a source region, a drain region, and a gate opposing a body region, wherein the signal input node is coupled to the gate of the third transistor, wherein the drain region is coupled to a positive voltage supply and the source region is coupled to a lower voltage potential, and wherein the drain region is coupled to the gate of the first transistor;
said second end of said transmission line being coupled to the signal input of a first one of the pair of cross coupled CMOS amplifiers; and
a second transmission line coupled to the signal input of a second one of the pair of cross coupled CMOS amplifiers.

18. The integrated circuit interconnection of claim 17, wherein the first transistor of a first conductivity type includes an n-channel metal-oxide semiconductor (NMOS) transistor, and wherein the second transistor of a second conductivity type includes a p-channel metal-oxide semiconductor (PMOS) transistor.

19. The integrated circuit interconnection of claim 18, wherein each amplifier in the amplifier circuit includes a fourth transistor of a first conductivity type having a source region, a drain region, and a gate opposing a body region, wherein the drain region is coupled to the source region for the first transistor.

20. The integrated circuit interconnection of claim 19, wherein the signal output node for each amplifier is cross coupled to the gate of the second transistor and the fourth transistor on the other amplifier.

21. The integrated circuit interconnection of claim 16 wherein the signal input node for each amplifier is coupled to a transmission line which has a length of at least 1000 micrometers.

22. The integrated circuit interconnection of claim 16 wherein the signal input node for each amplifier is coupled to a transmission line which has a length of at least 500 micrometers.

23. The integrated circuit interconnection of claim 1 wherein said termination circuit comprises an amplifier circuit coupled to the second end of said at least one transmission lines.

24. An integrated circuit interconnection comprising:
a transmission line having a characteristic impedance less than 100 Ohms, said transmission line including a first end and a second end;
a driver coupled to the first end of said transmission line;
a termination at the second end of said transmission line having an impedance corresponding to the characteristic impedance of said transmission line; and
a plurality of components selected from the group consisting of capacitive elements, inductive elements and a combination of capacitive and inductive elements, said components being connected at spaced intervals to said transmission line between said first and second ends to change an apparent length of said transmission line, wherein said termination circuit comprises an amplifier circuit coupled to the second end of the transmission line, wherein said amplifier circuit comprises:

a pair of cross coupled transistors;
a pair of output transmission lines, wherein each one of the pair of output transmission lines is coupled to a drain region on each one of the pair of cross coupled transistors; and
a single signal input node coupled to a source region for one of the pair of cross coupled transistors, wherein the amplifier circuit is able to provide a differential voltage signal to the pair of output transmission lines when a single ended input current of less than 1.0 mA is received at the single signal input node.

25. The integrated circuit interconnection of claim 24, wherein each one of the pair of output transmission lines coupled t o the drain region on each one of the pair of cross coupled transistors is further coupled to a gate for the other transistor in the pair of cross coupled transistors.

26. The integrated circuit interconnection of claim 25, wherein each transistor in the pair of cross coupled transistors an n-channel metal oxide semiconductor (NMOS) transistor.

27. The integrated circuit interconnection of claim 24, wherein the single signal input node is coupled to a current mirror.

28. The integrated circuit interconnection of claim 1 wherein said termination circuit comprises a pseudo differential amplifier circuit coupled to the second end of said at least one transmission line.

29. An integrated circuit interconnection comprising:
a transmission line having a characteristic impedance less than 100 Ohms, said transmission line including a first end and a second end;
a driver coupled to the first end of said transmission line;
a termination at the second end of said transmission line having an impedance corresponding to the characteristic impedance of said transmission line; and
a plurality of components selected from the group consisting of capacitive elements, inductive elements and a combination of capacitive and inductive elements, said components being connected at spaced intervals to said transmission line between said first and second ends to change an apparent length of said transmission line, wherein said termination circuit comprises a pseudo differential amplifier circuit coupled to the second end of the transmission line, and wherein said pseudo differential amplifier circuit comprises:
a first pair of metal oxide semiconductor field effect transistors (MOSFETs), wherein the first pair of MOSFETs are cross coupled;
a pair of load resistors, wherein each load resistor is coupled to a drain region for each MOSFET in the first pair of MOSFETS;
a pair of signal output nodes, wherein each one of the pair of signal output nodes is coupled to the drain region for each MOSFET in the first pair of MOSFETs;
a single signal input node coupled to a source region for one of the MOSFETs in the first pair of MOSFETs; and
a second pair of MOSFETs, wherein a drain region for each MOSFET in the second pair of MOSFETs is coupled to a source region of each MOSFET in the first pair of MOSFETs, and wherein the signal input node is coupled to a gate for each of the second pair of MOSFETs.

30. The integrated circuit interconnection of claim 29, wherein the pseudo differential amplifier is able to provide a different voltage signal to the pair of signal output nodes when current signal of 0.5 mA or less is received at the single signal input node.

31. The integrated circuit interconnection of claim 29 wherein the first pair of MOSFETs includes a first pair of n-channel metal oxide semiconductor (NMOS) transistors.

32. The integrated circuit interconnection of claim 29, wherein the second pair of MOSFETs includes a second pair of n-channel metal oxide semiconductor (NMOS) transistors.

33. The integrated circuit interconnection of claim 29, wherein said transmission line has a characteristic impedance of less than 50 Ohms.

34. The integrated circuit interconnection of claim 29, wherein the drain region for each MOSFET in the first pair of MOSFETs is coupled to a gate of the other MOSFET in the first pair of MOSFETs.

35. The integrated circuit interconnection of claim 1 wherein said termination circuit comprises a single ended amplifier circuit coupled to the second end of said at least one transmission line.

36. An integrated circuit interconnection comprising:
a transmission line having a characteristic impedance less than 100 Ohms, said transmission line including a first end and a second end;
a driver coupled to the first end of said transmission line;
a termination at the second end of said transmission line having an impedance corresponding to the characteristic impedance of said transmission line; and
a plurality of components selected from the group consisting of capacitive elements, inductive elements and a combination of capacitive and inductive elements, said components being connected at spaced intervals to said transmission line between said first and second ends to change an apparent length of said transmission line, wherein said termination circuit comprises a single ended amplifier circuit coupled to the second end of the transmission line, and wherein said single ended amplifier circuit comprises:
a pair of cross coupled amplifiers, wherein each amplifier comprises:
a load resistor;
a first transistor having a source region, a drain region coupled to the load resistor, and a gate opposing a body region;
a signal output node coupled to the drain region for the first transistor;
a second transistor having a source region, a drain region, and a gate opposing a body region, wherein the drain region of the second transistor is coupled to the source region of the first transistor; and
a signal input node coupled to the source region for the first transistor in one of the cross coupled amplifiers, wherein the signal input node is further coupled to the gate in each second transistor.

37. The integrated circuit interconnection of claim 36, wherein the single ended amplifier provides an amplified output signal to the output nodes in the pair of cross coupled amplifiers when a 0.5 mA single ended input current is received at the single signal input node.

38. An integrated circuit interconnection comprising:
a transmission line having a characteristic impedance less than 100 Ohms, said transmission line including a first end and a second end;
a driver coupled to the first end of said transmission line;
a termination at the second end of said transmission line having an impedance corresponding to the characteristic impedance of said transmission line; and a plurality of components selected from the group consisting of capacitive elements, inductive elements and a combination of capacitive and inductive elements, said components being connected at spaced intervals to said transmission line between said first and second ends to change an apparent length of said transmission line, wherein said termination circuit comprises a single ended amplifier circuit coupled to the second end of the transmission line, and wherein said termination circuit comprises a current sense amplifier circuit coupled through a signal input node to the second end of said transmission line, said current sense amplifier comprising:

a first transistor of a first conductivity type;

a second transistor of a second conductivity type, wherein the first and second transistors are coupled at a drain region; and said signal input node coupled to a source region of the first transistor; and a signal output node coupled to the drain region of the first and second transistor in the current sense amplifier, and wherein the signal output node is further coupled to a gate of a third transistor.

39. The integrated circuit interconnection of claim 38 wherein a source region of the third transistor is coupled to a source region of the second transistor, and wherein a drain region of the third transistor is coupled to the signal input.

40. The current sense amplifier of claim 38, wherein the first transistor of a first conductivity type includes an n-channel metal oxide semiconductor (NMOS) transistor, and wherein the second transistor of a second conductivity type includes a p-channel metal oxide semiconductor (PMOS) transistor.

41. The current sense amplifier of claim 38, wherein the drain region for the first and the second transistor in the first amplifier are coupled to gates of the second transistor in the first and the second amplifier.

42. The current sense amplifier of claim 38, wherein the third transistor is an n-channel metal oxide semiconductor (NMOS) transistor.

43. The current sense amplifier of claim 38, wherein the signal input node of the first amplifier receives an input current, and wherein the signal input node of the second amplifier receives a reference current.

44. An integrated circuit interconnection for minimizing clock skews among a plurality of transmission lines, comprising:

at least one transmission line having a characteristic impedance less than 100 Ohms, said at least one transmission line including a first end and a second end;

a driver coupled to the first end of said at least one transmission line;

a termination circuit at the second end of said at least one transmission line having an impedance corresponding to the characteristic impedance of said at least one transmission line for reducing ringing and reflections, said termination including a current sense amplifier coupled to the second end of said at least one transmission line; and a plurality of components selected from the group consisting of capacitive elements, inductive elements and a combination of capacitive and inductive elements, said components being connected at spaced intervals to said at least one transmission line between said first and second ends for changing the propagation constant and delay time of said at least one transmission line so as to match with at least one other of said plurality of transmission lines.

45. The integrated circuit interconnection of claim 44 wherein said components are a plurality of capacitive elements.

46. The integrated circuit interconnection of claim 44 wherein said components are a plurality of inductive elements.

47. The integrated circuit interconnection of claim 44 wherein said components are a combination of capacitive and inductive elements.

48. The integrated circuit interconnection of claim 44 wherein a current sense amplifier is coupled to the second end of said at least one transmission line.

49. The integrated circuit interconnection of claim 44 wherein a plurality of interconnection lines are connected to said at least one transmission line.

50. The integrated circuit interconnection of claim 45 wherein said capacitive elements are selected from the group consisting of metal-metal, metal-polysilicon and polysilicon-polysilicon capacitors.

51. The integrated circuit interconnection of claim 45 wherein said capacitive elements are gate capacitances of field effect transistors used as capacitors.

52. The integrated circuit interconnection of claim 46 wherein said inductive elements are spiral inductors serially implanted in said at least one transmission line.

53. The integrated circuit interconnection of claim 46 wherein said inductive elements are formed by depositing material with a higher magnetic permeability on said at least one transmission line for increasing self inductance of said at least one transmission line.

54. The integrated circuit interconnection of claim 49 wherein said current sense amplifier has an input impedance of less than 50 Ohms.

* * * * *

UNITED STATES PATENT AND TRADEMARK OFFICE
CERTIFICATE OF CORRECTION

PATENT NO. : 6,380,787 B1
DATED : April 30, 2002
INVENTOR(S) : Leonard Forbes

It is certified that error appears in the above-identified patent and that said Letters Patent is hereby corrected as shown below:

Column 1,
Line 66, change "with" to -- which --.

Column 4,
Line 46, replace "signal and only" with -- signal only --.

Column 6,
Line 56, replace "amount" with -- amounts --.

Column 7,
Line 1, replace "comprise" with -- comprises --.

Column 8,
Line 4, replace "coupled a" with -- coupled with a --.

Column 14,
Line 49, replace "lines" with -- line --.

Signed and Sealed this

Fifth Day of November, 2002

Attest:

JAMES E. ROGAN
Attesting Officer   Director of the United States Patent and Trademark Office